United States Patent [19]

Bossen et al.

[11] Patent Number: 5,161,163
[45] Date of Patent: * Nov. 3, 1992

[54] METHOD AND APPARATUS FOR PROVIDING ERROR CORRECTION TO SYMBOL LEVEL CODES

[75] Inventors: Douglas C. Bossen, Poughkeepsie; Chin-Long Chen, Wappingers Falls; Mu-Yue Hsiao, Poughkeepsie, all of N.Y.

[73] Assignee: International Business Machines Corporation, Armonk, N.Y.

[*] Notice: The portion of the term of this patent subsequent to Dec. 3, 2008 has been disclaimed.

[21] Appl. No.: 741,021

[22] Filed: Aug. 6, 1991

Related U.S. Application Data

[63] Continuation of Ser. No. 370,935, Jun. 23, 1989, Pat. No. 5,070,504.

[51] Int. Cl.$^5$ .................. G06F 11/10; H03M 13/00
[52] U.S. Cl. ................................. 371/54; 371/37.1; 371/53; 371/49.3
[58] Field of Search ............... 371/37.1, 53, 54, 49.3; 235/437, 431; 382/57

[56] References Cited

U.S. PATENT DOCUMENTS

3,815,495  6/1974  Strackbein .................. 371/54 X
4,742,521  5/1988  Nishida ........................ 371/54

Primary Examiner—Robert W. Beausoliel
Assistant Examiner—Ly V. Hua
Attorney, Agent, or Firm—Lawrence D. Cutter

[57] ABSTRACT

An error correction coding system employs a single check symbol from an arbitrary sequence of information symbols to provide single error correction at the symbol level. The sequence of information symbols may in fact also be arbitrarily long. The coding system of the present invention provides both a method and apparatus for encoding the check symbol and a method and apparatus for error correction based upon the single coded symbol character. The system is particularly applicable for use in conjunction with bar code recognition systems but is in fact applicable to a broad range of coding systems, including optical character recognition and ordinary alphanumeric codes. The system is also extendable to any system employing an odd number of code symbols that may be present in a single character position.

3 Claims, 7 Drawing Sheets

FIG. 1 ENCODING PROCESS

BC412 CODE

| SYMBOL | CHARACTER VALUE | BAR/SPACE SEQUENCE |
|---|---|---|
| 0 | 0 | B-B-B-B----- |
| 1 | 1 | B-B-B--B---- |
| 2 | 2 | B-B-B---B--- |
| 3 | 3 | B-B-B----B-- |
| 4 | 4 | B-B-B-----B- |
| 5 | 5 | B-B--B-B---- |
| 6 | 6 | B-B--B--B--- |
| 7 | 7 | B-B--B---B-- |
| 8 | 8 | B-B--B----B- |
| 9 | 9 | B-B---B-B--- |
| A | 10 | B-B---B--B-- |
| B | 11 | B-B---B---B- |
| C | 12 | B-B----B-B-- |
| D | 13 | B-B----B--B- |
| E | 14 | B-B-----B-B- |
| F | 15 | B--B-B-B---- |
| G | 16 | B--B-B--B--- |
| H | 17 | B--B-B---B-- |
| I | 18 | B--B-B----B- |
| J | 19 | B--B--B-B--- |
| K | 20 | B--B--B--B-- |
| L | 21 | B--B--B---B- |
| M | 22 | B--B---B-B-- |
| N | 23 | B--B---B--B- |
| P | 24 | B--B----B-B- |
| Q | 25 | B---B-B-B--- |
| R | 26 | B---B-B--B-- |
| S | 27 | B---B-B---B- |
| T | 28 | B---B--B-B-- |
| U | 29 | B---B--B--B- |
| V | 30 | B---B---B-B- |
| W | 31 | B----B-B-B-- |
| X | 32 | B----B-B--B- |
| Y | 33 | B----B--B-B- |
| Z | 34 | B-----B-B-B- |

FIG. 5

ERROR CORRECTION EXAMPLE

| POSITION | BAR/SPACE SEQUENCE | DECODED CHARACTER | CHARACTER VALUE |
|---|---|---|---|
| 1 | B-B---B--B-- | A | 10 |
| 2 | B-B--B----B- | 8 | 8 |
| 3 | B-B-----B-B- | E | 14 |
| 4 | B-B--B---B-- | 7 | 7 |
| 5 | B-B-B--B---B | ERASURE | ? |
| 6 | B-B-B----B-- | 3 | 3 |
| 7 | B-B---B-B--- | 9 | 9 |

DECODED SEQUENCE = A8E7139

FIG. 7

METHOD AND APPARATUS FOR PROVIDING ERROR CORRECTION TO SYMBOL LEVEL CODES

This is a continuation of copending application Ser. No. 07/370,935, filed on Jun. 23, 1989, now U.S. Pat. No. 5,070,504.

BACKGROUND OF THE INVENTION

The present invention is generally directed to error correction and detection systems which are employable with character or symbol codes. More particularly, the present invention is related to a method and apparatus for providing a check character for an arbitrary sequence of information symbols. The invention also includes a system for decoding a received sequence of processed character symbols and for detecting the presence of an error in a single position amongst the received character symbol signals. Even more particularly, the present invention pertains to error correction and detection schemes usable with bar code systems.

In particular, it is known that bar codes are capable of providing a means for identification of objects in ways that do not require optical character recognition (OCR) of a plurality of alphanumeric or other symbols. In general, bar codes typically employ a series of stripes of varying widths in sequence to represent a particular character symbol. Also, as described in application Ser. No. 07/351,902 filed May 15, 1989, it is seen that one may employ bar codes which exhibit only a single width bar. Furthermore, it is seen that it is possible to construct such codes so as to employ built-in timing indications. While such codes are reliable, it is possible to employ such codes and other codes in environments in which there may be a certain undesirable degradation of reading accuracy. Accordingly, the present invention is directed to systems for encoding character symbols to provide for redundancy and error correction. In the present invention encoding and decoding systems are in fact employed at the symbol level rather than at the bit or bar level.

Furthermore, it is seen that the code of the present invention is applicable to any symbol based coding system. In particular, the present system is also applicable to OCR fonts. Coding systems of the present kind are therefore seen to be particularly valuable when symbol codes of any sort are employed in hostile environments in which high degrees of reading accuracy are not always achievable. Accordingly, it is seen that the system of the present invention is particularly applicable to the situation in which single width bar codes with built-in timing characteristics are employed in conjunction with the processing of silicon semiconductor wafers which are processed in harsh environments. It is further seen that the code of the present invention is applicable to any symbol based code and is not limited to bar codes or OCR fonts but may also be employed in conjunction with any code in which the bits or bars are grouped into subordinate packages. It is also applicable directly to ordinary symbol fonts where there is no subordinate representation of code symbols.

SUMMARY OF THE INVENTION

In accordance with a preferred embodiment of the present invention, a method is provided for generating a check character for an arbitrary sequence of M information symbols which are selected from a set of N code symbols (an alphabet if you will). The method comprises a plurality of steps, the first of which is to assign a sequence of N distinct numerical character values to the N code symbols. Next, an arbitrary message sequence of M information symbols is selected from the set of N code symbols. A position j is assigned for the check character which is selected to be one of a set of M+1 numerically labelled positions. These positions correspond to the M information character positions and the one check character position. The check character is initially assigned a numerical character value of 0. Two subtotals are computed: $F_e$ and $F_o$. These sums are computed by adding together the character values associated with the code symbols in evenly labelled and odd labelled character positions respectively. This summation is carried out modulo N. In particular, modular arithmetic is performed throughout the present application and should be assumed to be the case unless otherwise specified. This modular addition (and/or multiplication as the case arises) is exactly like ordinary multiplication and addition except that, in effect, the ordinary result is divided by N and the actual result is taken to be the remainder which occurs as the consequence of the division operation. Next, the check sum $F_o + 2F_e$ (modulo N) is computed. The check character value associated with position j is computed as $[(N-1)/2] \cdot F$, where F is the sum $F_o + 2F_e$. The resultant character value, CV(j) is used to assign a code symbol, having that character value, to the check position. It is also noted in the description above that the square brackets denote "the greatest integer less than or equal to" as applied to whatever arguments occur between the brackets. This notational convention is employed throughout the present application.

The present invention is also directed to a method for correcting a received sequence of character symbols which have been encoded in accordance with the present invention. In particular, the method of the present invention is particularly applicable when a single erasure occurs during receipt of a sequence of character symbols. In this situation, a character value of 0 is initially assigned to the erasure position. The pre-established numerical character values of the code are assigned to the other received positions. Next, as above, the sum of preassigned character values associated with the odd numbered positions in the sequence is generated. As above, this summation is carried out modulo N and yields the result $F_o$. In a similar fashion, the character values associated with the evenly numbered positions are calculated to generate the sum $F_e$ (again modulo N). Next, the check sum F is generated as $F_o + 2F_e$ (modulo N). The character value of the erasure position j is then computed as $-F$ if j is odd and as $[(N-1)/2] \cdot F$ (modulo N) if j is even. Lastly, a character symbol is associated with the character value generated in this manner.

This correction method is employable in conjunction with more generic error correction methodologies which take into account the number of erasures and the role of the check sum F. An apparatus for carrying out the methods of the present invention is also described.

Accordingly, it is an object of the present invention to provide a method and apparatus for the detection and correction of symbol level reading or transmission errors.

It is also an object of the present invention to extend the applicability, robustness and reliability of bar code readers and bar code systems.

It is yet another object of the present invention to provide a single error correction and detection system for use with symbol level codes.

Lastly, but not limited hereto, it is an object of the present invention to provide symbol level correction and detection systems for bar codes, OCR fonts and other symbol based coding methods, particularly those employed in the identification of semiconductor wafers during the fabrication of very large scale integrated (VLSI) circuit chips.

DESCRIPTION OF THE DRAWINGS

The subject matter which is regarded as the invention is particularly pointed out and distinctly claimed in the concluding portion of the specification. The invention, however, both as to organization and method of practice, together with further objects and advantages thereof, may best be understood by reference to the following description taken in connection with the accompanying drawings in which:

DETAILED DESCRIPTION OF THE INVENTION

Figure 1:
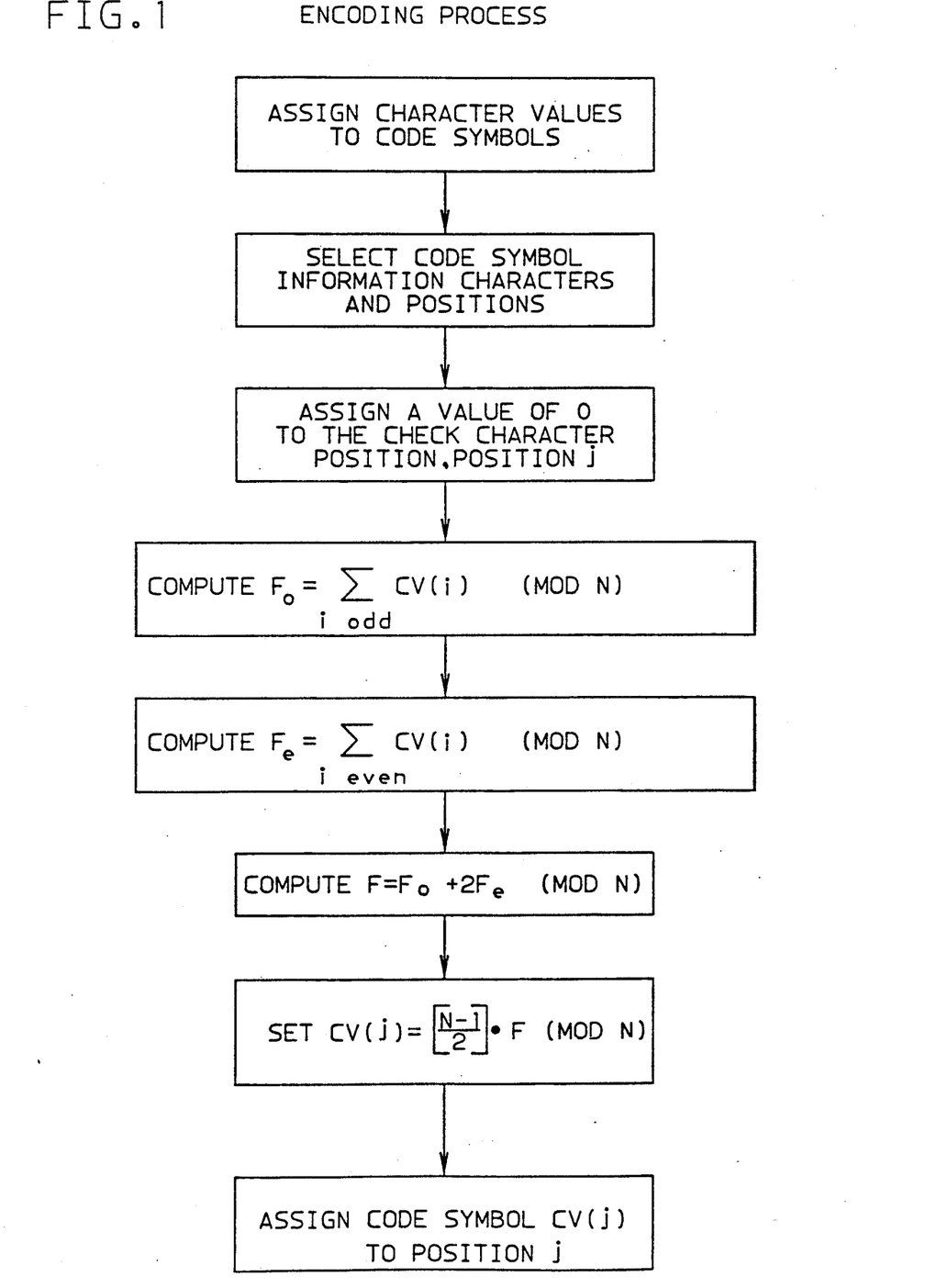
FIG. 1 is a block diagram flowchart representing an encoding process which is carried out in accordance with the present invention.

A preferred embodiment of the encoding process of the present invention is illustrated in FIG. 1. In accordance with the process illustrated therein, numerical character values are assigned to the desired code symbols which are to be included in the set of symbols to be transmitted and/or recognized. The assignment is made from the set of integers ranging from 0 up to the value $N-1$ where $N$ is the number of distinct code symbols which are to be processed. The assignment of numerical character values to code symbols is however essentially one of convenience which permits the coding process described herein to be described and understood in terms of arithmetic modulo $N$.

In general, arithmetic modulo $N$ can be described essentially as follows. Arithmetic modulo $N$ involves the addition and multiplication of integers ranging from 0 through $N-1$. The operations of addition and multiplication are carried out in the normal arithmetic fashion to produce a result. However, in arithmetic modulo $N$ the result obtained is only an intermediate result, the actual final result being given by the remainder that is produced when the ordinary (intermediate) result is divided by $N$. Since this remainder is always between 0 and $N-1$, modulo $N$ arithmetic always produces an integer between 0 and $N-1$. This arithmetic is more particularly illustrated for the case in which $N=5$ in the two tables presented below. In particular, Table I illustrates the results produced when adding integers modulo 5. In a similar fashion, Table II illustrates the modular arithmetic results obtained when multiplying integers modulo 5.

TABLE I

| + | 0 | 1 | 2 | 3 | 4 |
|---|---|---|---|---|---|
| 0 | 0 | 1 | 2 | 3 | 4 |
| 1 | 1 | 2 | 3 | 4 | 0 |
| 2 | 2 | 3 | 4 | 0 | 1 |
| 3 | 3 | 4 | 0 | 1 | 2 |
| 4 | 4 | 0 | 1 | 2 | 3 |

TABLE II

| · | 0 | 1 | 2 | 3 | 4 |
|---|---|---|---|---|---|
| 0 | 0 | 0 | 0 | 0 | 0 |
| 1 | 0 | 1 | 2 | 3 | 4 |
| 2 | 0 | 2 | 4 | 1 | 3 |
| 3 | 0 | 3 | 1 | 4 | 2 |
| 4 | 0 | 4 | 3 | 2 | 1 |

It is noted though that in order for the system of the present invention to function as described, $N$ must be an odd integer.

Next, in accordance with the encoding process illustrated in FIG. 1, the message sequence of code symbol information characters is selected. In particular, it is noted that any position within the sequence of code symbols may be selected as being a check character position.

In the next step of the process a character value of 0 is assigned to the check character position which is referred to generally herein as position j. In general, j will range from 1 to $M+1$ for the situation in which there are M information characters and one redundant check position character.

Further in accordance with the process shown in FIG. 1, two sums are computed. These sums may be computed in either order or simultaneously. In particular, for each of the $M+1$ character values, CV(i), that are associated with odd symbol positions a summation of these values, modulo $N$, is carried out. That is, the sum $CV(1)+CV(3)+CV(5)+\ldots$ is computed modulo $N$. This is a partial check sum and is denoted herein by the symbol $F_o$. In a similar fashion, the character values associated with even symbol positions are likewise added together to form the sum $CV(2)+CV(4)+CV(6)+\ldots$ modulo $N$. This is also a partial check sum and is denoted herein by the symbol $F_e$.

Next, the overall check sum F is computed as $F_o+2 F_e$ modulo $N$. The formation of the check sum F is essential for encoding a character symbol to be used in a check position. In particular, the number $[(N-1)/2]\cdot F$ modulo $N$ is next computed. It is noted that the brackets used herein and in the figures and in the appended claims, denote the greatest integer less than or equal to the value of the numerical expression shown between the brackets. However, in general it is noted that when $N$ is odd the expression $(N-1)/2$ within the brackets is always a whole integer anyway. In any event, the resultant integer is multiplied by the check sum F using base $N$ modular arithmetic base $N$ as described above. Thus the number that results is always an integer from 0 to N−1. This numerical value is set equal to CV(j) the character value associated with the $j^{th}$ position, that is, the check position.

Lastly, in accordance with the present invention, an assignment of code symbols to a character value is made. In particular, the appropriate code symbol is associated with the value CV(j) thus completing the encoding process shown in FIG. 1.

Figure 2:
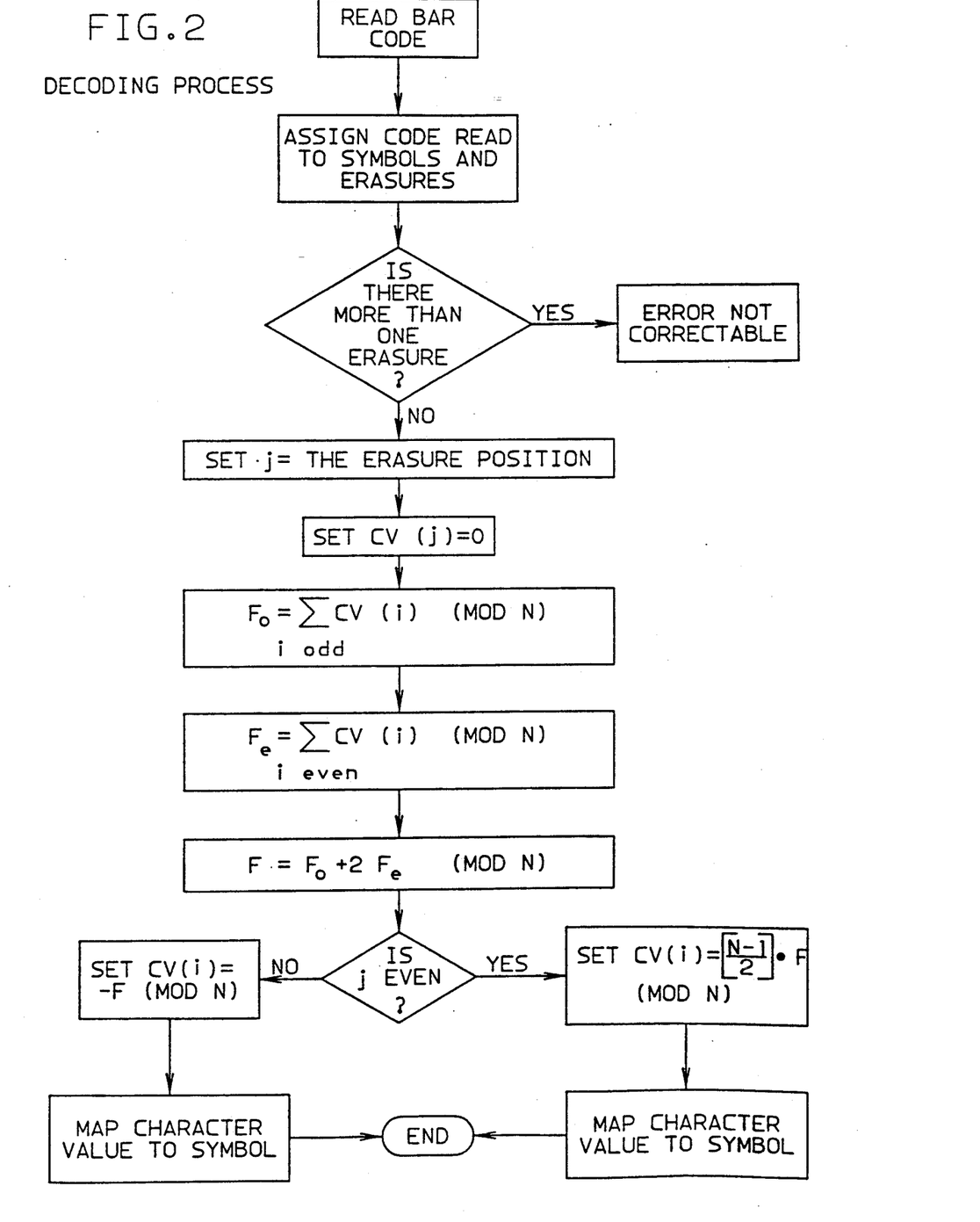
FIG. 2 is a block diagram flowchart illustrating the decoding process of the present invention.

If the encoding process is to be of value, then a corresponding decoding process must also be possible to construct. In particular, such a decoding process is illustrated in FIG. 2. FIG. 2 illustrates the process undertaken when a single erasure has occurred in transmission or recognition circuitry. It should also be noted that while FIG. 2 is particularly directed to the situation in which a bar code is read to produce a sequence of code symbol characters, that the decoding process and in general the system of the present invention, is much more widely applicable than is suggested by the bar code example. Thus the function block labelled "READ BAR CODE" shown in FIG. 2 is merely representative of any number of process steps in which a sequence of character symbols is read or received.

The next step in the decoding process is to assign numerical values to the sequence of code symbols that are produced during reading or reception operations. It is noted that during these operations it is possible that not all symbols are recognized or detected. In this case, an erasure is indicated for that position. If there is more than one erasure, then an error has occurred which is not directly correctable by the present encoding and decoding system (see FIG. 3 discussed below). Accordingly, it is a preferred embodiment of the present invention that an uncorrectable error indication be provided. If however there is only one erasure position, this position is denoted as position j and the character value associated with this position is initially set equal to 0. The character values associated with the other positions are left unaltered. Next, as described above, sums $F_o$ and $F_e$ are computed. For sum $F_o$ the summation is made for character values associated with symbol positions bearing an odd index label. Likewise, for the sum $F_e$, the summation is carried out for character values associated with even indexed character symbols. Next, the overall check sum F is computed as $F_o + 2 F_e$. As above, the summations and the multiplication are all carried out modulo N.

If the erasure position, namely position j, is an odd indexed position then the character value associated with this position is set equal to the additive inverse modulo N of the check sum F. That is, CV(j)=−F modulo N. In general, this additive inverse is very easy to compute simply by subtracting the value F from the modulo base N. For example, if N=35 and F=23 then −F=12, since 23+12=35=0 (modulo 35).

Similarly, if j denotes an even index such as 2, 4, 6, or 8, ... then CV(j) is set equal to [(N−1)/2]·F modulo N. Thus, in either event, a value for CV(j) ranging from 0 to (N−1) is generated. This character value is then used to determine the symbol with which it is associated. This symbol is the same symbol as used during the encoding process described above. As will seen below, this decoding process permits correction of a single erasure error which occurs when the code symbol read does not correspond to any of the predetermined patterns.

Figure 3:
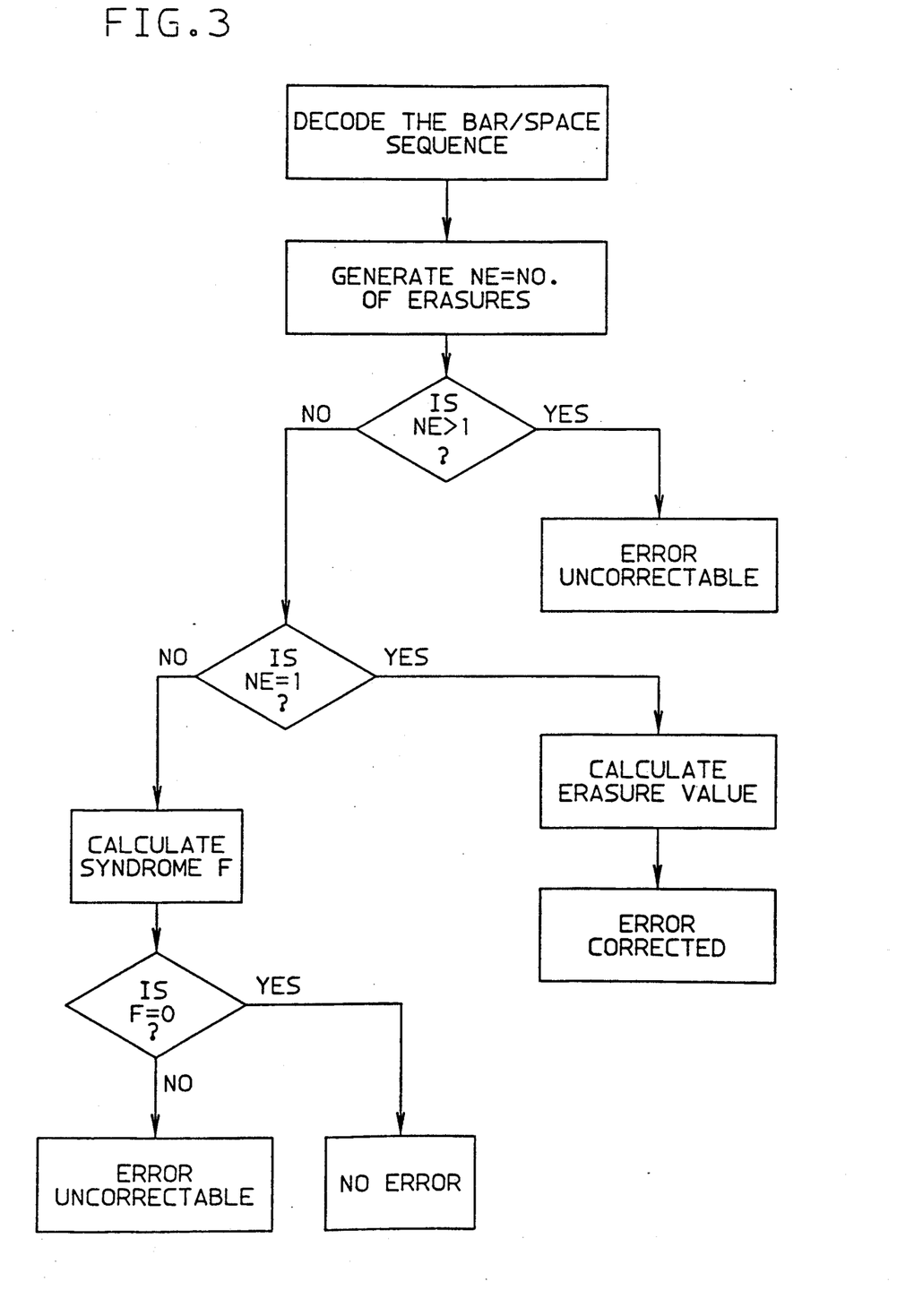
FIG. 3 is a block diagram flowchart illustrating the logical flow when the present invention is employed in conjunction within an overall framework of erasure computation and syndrome checking.

The decoding process described herein may in fact be employed as part of an overall decoding process such as that illustrated in FIG. 3 which shows a more encompassing decoding process. In particular, the process illustrated in FIG. 2 essentially comprises only a single functional block in FIG. 3, namely the block titled "CALCULATE ERASURE VALUE". In particular, the process illustrated in FIG. 3 describes a sequence of operations beginning with the decoding of the bar/space sequence (or other code symbol sequence). The sequence of characters recognized by the scanning circuitry is then used to determine whether or not an erasure has occurred. An erasure occurs whenever the sequence of electrical patterns produced by the receiver, reader or recognizer is not matched or paired with an appropriate character symbol. If the number of erasures, NE, detected is greater than 1, an uncorrectable error indication signal is provided, as shown. However, if the number of erasures is 1 then the process illustrated in FIG. 2 is employed to correct the single erasure. An example of this correction is provided below. However, if there are no erasures, it is still necessary make sure that other errors have not occurred. Accordingly, if a situation in which the number of erasures, NE, is equal to 0, then the check sum syndrome F is calculated, as described above, as $F_o + 2 F_e$. If F is 0 then no error has occurred and the sequence can be accepted as recognized. However, if F is not equal to 0 then an uncorrectable error has occurred and an indication to this effect is preferably provided.

Figure 4:
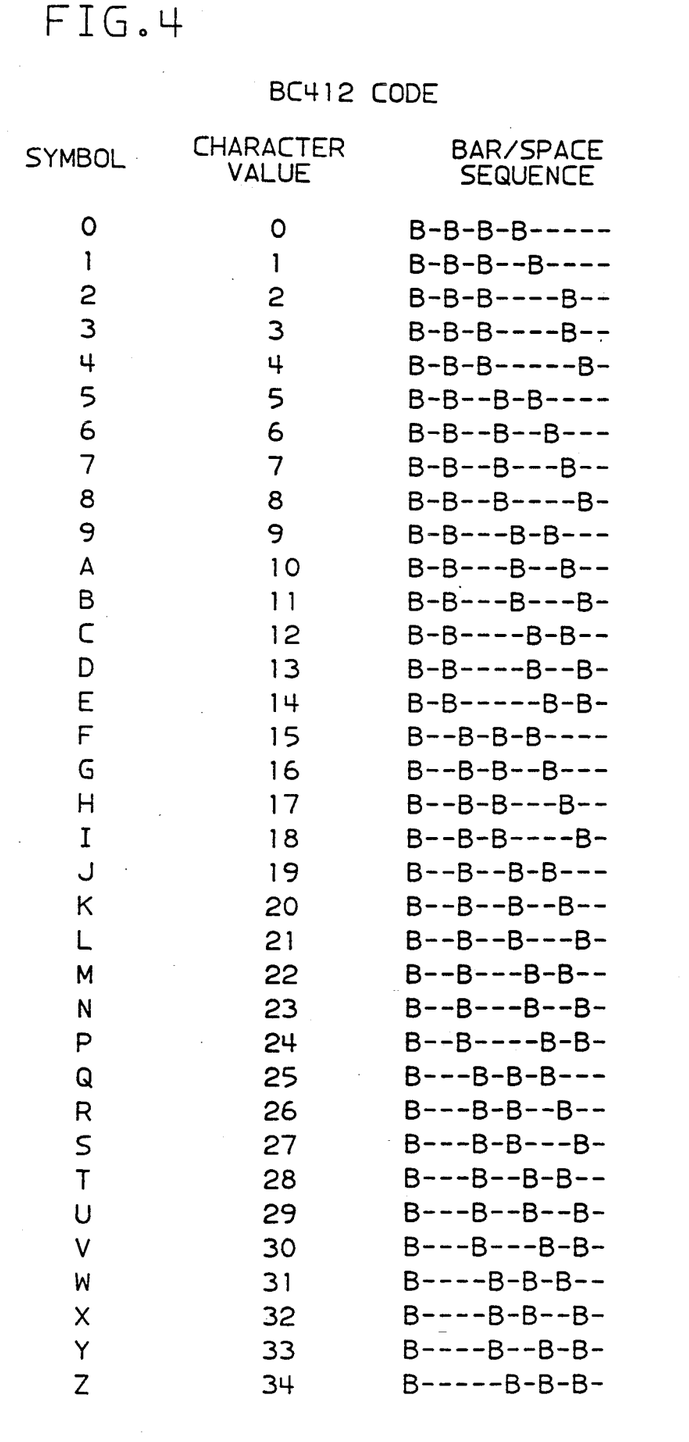
FIG. 4 illustrates a bar code that may be employed in conjunction with the present invention and particularly illustrates numerical character values associated with the symbols represented therein.

By way of illustration, and not limitation, a bar code which is employable in conjunction with the coding method of the present invention is illustrated in FIG. 4. In particular, the bar code illustrated has several unique properties. In the illustration the character "B" represents a single vertical stripe (bar) of fixed width. The character "−" represents a single blank space between bars. The BC412 code, shown in FIG. 4, is therefore a single width bar code. Furthermore, it possesses the special property that it has a self-timing characteristic. This property is useful in insuring code reliability and robustness in the face of scanning speed variations. In particular, it is seen that the beginning of the code is always recoverable as a combination "bar and blank" occurring at every 12th time slot. In particular, it is seen that this code is capable of representing 35 different symbols, namely the numeric characters from "0" through "9" and the alphabetic characters "A" through "Z", except the letter "O". In accordance with the present invention, each one of these 35 symbols is associated with a unique character value ranging from 0 through N−1. Here N is 35. It is also noted that the character values start at 0 and include all of the integers up to and including N−1. This is an important aspect of the present invention when, as here, its implementation is described in terms of modular arithmetic. In particular, it is seen that modular arithmetic always produces character values ranging from 0 through N−1 and is accordingly suitable for code representations.

An example of encoding and decoding in accordance with the system of the present invention is now presented. In particular, for the sake of example, it is assumed that the check character position is the second position in the sequence of otherwise arbitrarily selected characters. In particular, consider the arbitrary message sequence "A E7139". The character values associated with these seven positions (see FIG. 4) are as follows:

TABLE III

| Symbol | Position i | CV (i) |
|--------|-----------|--------|
| A | 1 | 10 |
|   | 2 | 0 |
| E | 3 | 14 |
| 7 | 4 | 7 |
| 1 | 5 | 1 |
| 3 | 6 | 3 |
| 9 | 7 | 9 |

Note in the above that the initial character value associated with the check sum position (i=2) is 0. Thus, the character values associated with the odd positions, namely the positions for which i is equal to 1, 3, 5, and 7 are 10, 14, 1 and 9 respectively. Thus, $F_O$ may be computed as follows: $F_o=10+14+1+9=34$. In a similar fashion $F_e$ may be calculated as the sum of the character values associated with evenly numbered positions, that is for i=2, 4 and 6. Accordingly, it is seen that $F_e=0+7+3=10$. It is noted that so far in this example the summations carried out are the same as those that would result from ordinary arithmetic since no ordinary sum exceeds 35. However, attention is now directed to the calculation of the check sum F as $F_o+2 F_e$. Thus in this example, $F=34+(2 \cdot 10)=34+20=54 \mod 35=19$. In this latter computation, the "modular" aspects of the arithmetic computations are seen more specifically.

Lastly, a character value for the second or check sum position is calculated. This value, designated CV(2) is calculated as $[(N-1)/2] \cdot F$ modulo N, where here N=35 and (N−1)/2=17. Thus, [17]=17. Thus, for the check position j=2, CV(2)=17·F mod 35, where F=19 from the calculation above for $F_o+2 F_e$. In this case, 17·19=323 (mod 35)=9×35+8. Thus, CV(2)=8. Thus the desired encoded sequence is "A8E7139". Thus the process described in FIG. 1, when applied to the sequence "A E7139" produces the coded sequence "A8E7139". It is this coded sequence which provides single error correction in the case of the presence of a single erasure.

Figure 5:
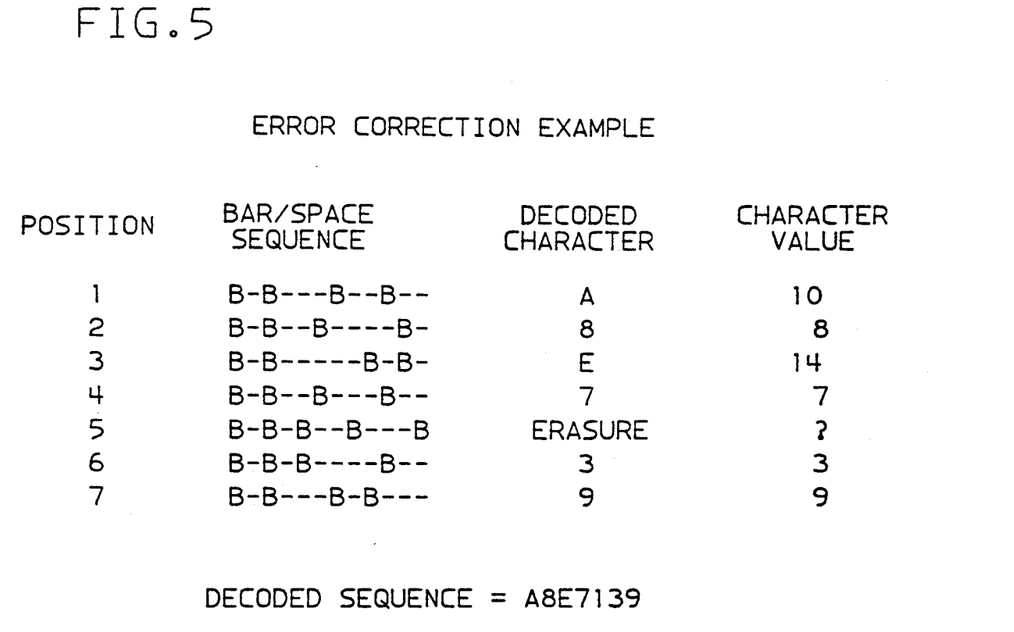
FIG. 5 illustrates an example of the correction of an erasure in accordance with the process of the present invention.

Attention is now directed to the decoding process illustrated in FIG. 2. Again, this example continues the assumptions made above with respect to the character values shown in FIG. 4. In particular, attention is directed to FIG. 5 which illustrates an example of a sequence of bars and spaces which are received, detected or recognized. In particular, it is seen that for position i=5 an erasure occurs. However, the decoding process of FIG. 2 is now employed to correctly identify the erasure symbol. To start, the character value associated with the erasure position is set equal to 0. In particular in this case, CV(5)=0. As indicated, values for $F_o$ and $F_e$ are computed. In particular, it is seen that $F_o=10+14+0+9=33$. Likewise, as above, $F_e=8+7+3=18$. $F_o+2 F_e$ is then computed as 33+2(18)=33+36=69 (mod 35=34. Since the erasure position j is denoted by an odd integer, the character value associated with this position, namely CV(5) is computed as −F modulo N. In this particular instance, F=34 and −F=1 since 1+34=35. Thus, the character value associated with the erasure position is 1, that is CV(5)=1. This number is then used in conjunction with the sample correspondence shown in FIG. 4 wherein it is seen that the symbol associated with a character value of 1 is 1. These results are summarized in FIG. 5.

Solely for the sake of example, if CV(5) had turned out to be 13, then −F would have been 22, in which case the corresponding symbol associated with the character value of 22 would be M in accordance with FIG. 4.

Figure 6:
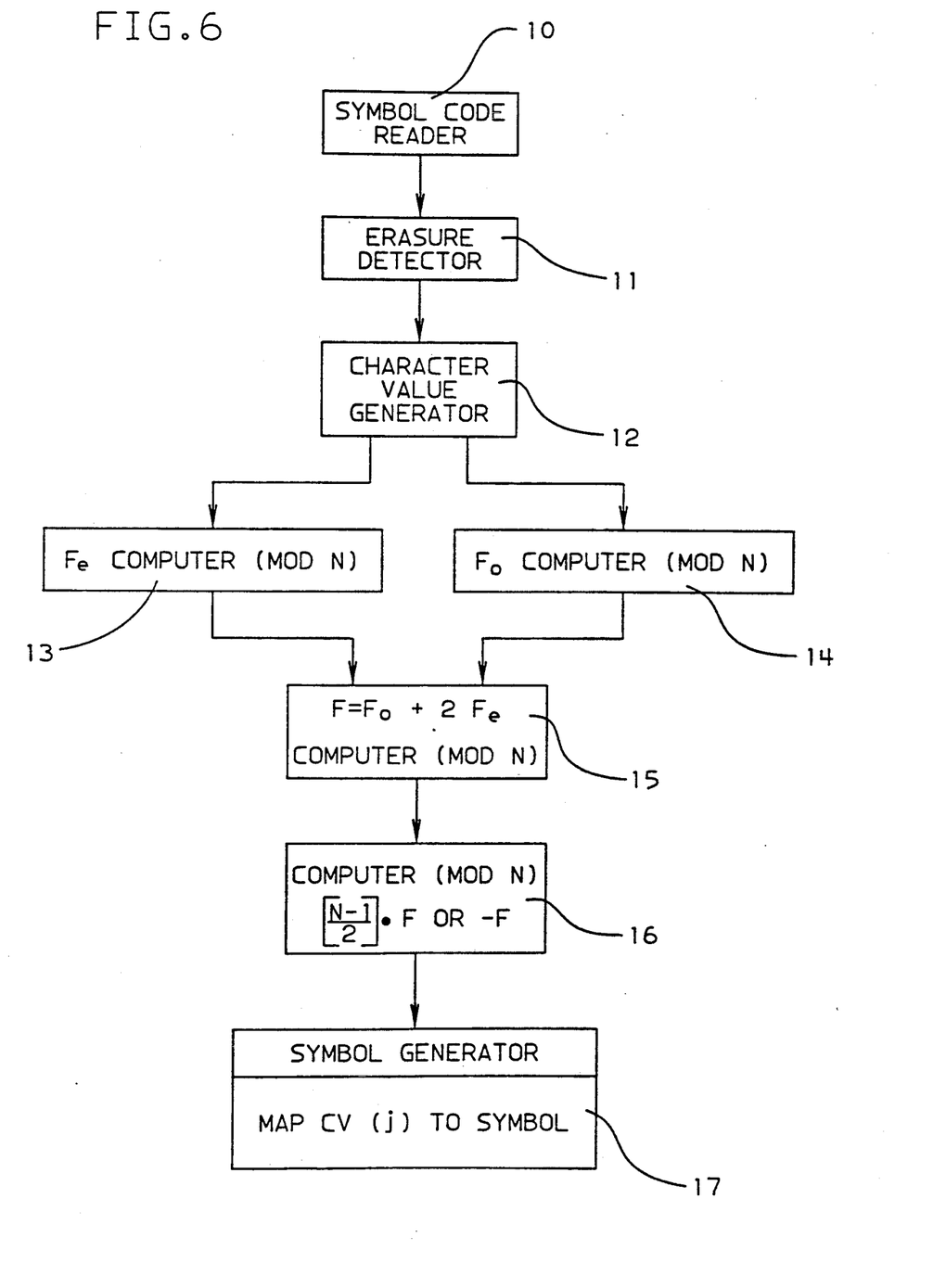
FIG. 6 illustrates a functional block diagram of an apparatus for error correction in accordance with the present invention.
Figure 7:
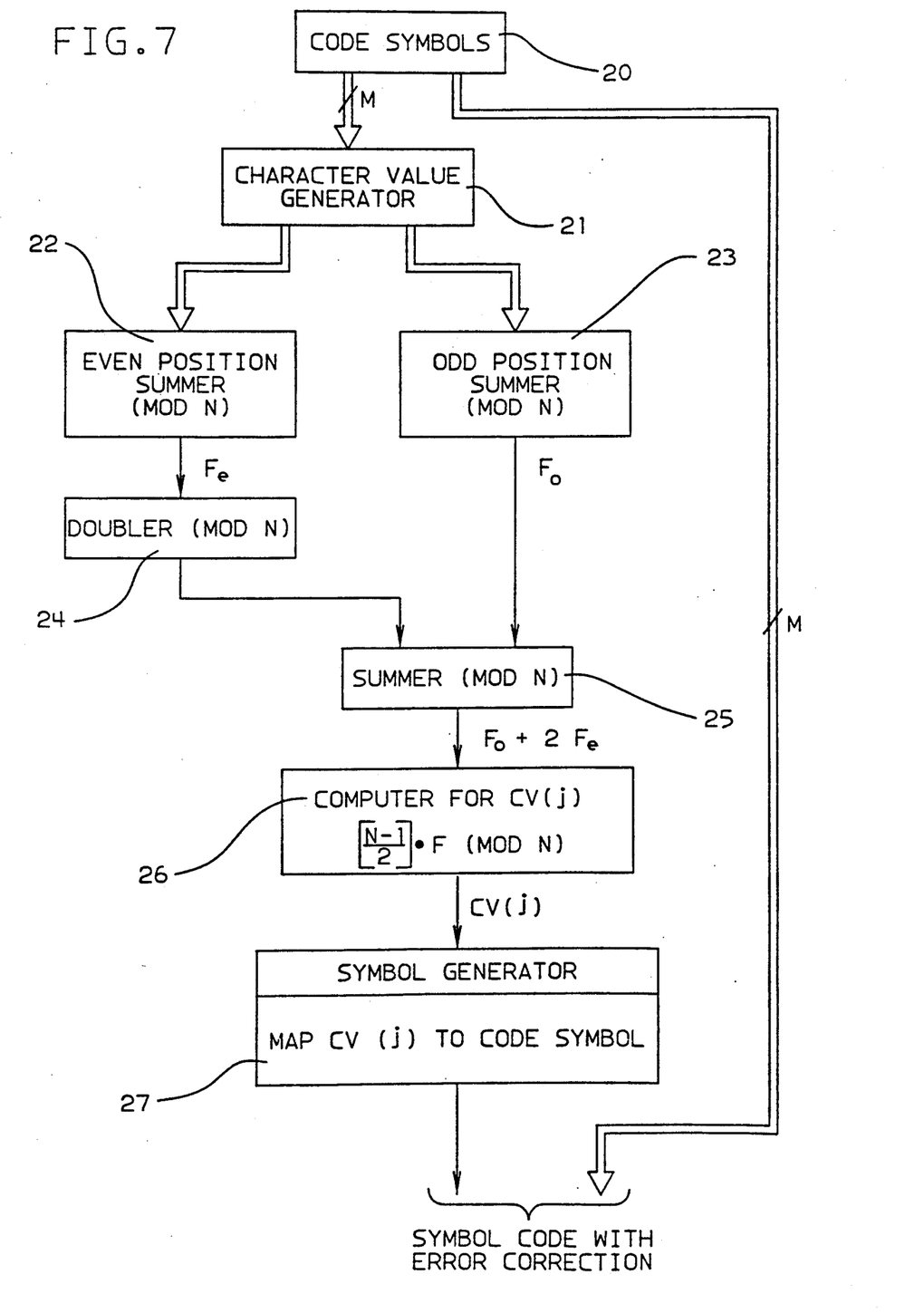
FIG. 7 illustrates a functional block diagram of an apparatus capable of producing redundant correctable code symbols in accordance with a preferred embodiment of the present invention.

In accordance with apparatus embodying the present invention, attention is now specifically directed to FIGS. 6 and 7. In particular, FIG. 6 illustrates a correcting decoder operating in accordance with the principles of the present invention. It is seen that symbol code reader 10 provides signals to erasure detector 11 which determines those positions in which an erasure has occurred. That is, erasure detector 11 operates to find those symbol signals from reader 10 which do not correspond to known signal representations. Erasure detector 11 thus provides an indication that an erasure has occurred in one of the symbol positions. The symbol representations, together with the indication of an erasure, is provided to character value generator 12. Generator 12 provides numerical character value signals for each of the symbol positions read. A character value of 0 is assigned to the erasure position. The numeric character values supplied by generator 12 are preferably divided in accordance with whether or not the associated symbol position bears an even or odd integer index designation. The character values associated with even indexed positions are supplied to modulo N summing computer 13 which computes a value for $F_e$, as described above. In a similar fashion, the character values associated with odd indexed positions are supplied to modulo N summer 14 which operates to compute a value for $F_o$. These two sums are supplied to modulo N computational unit 15 which generates the value $F=F_o+2 F_e$. The result of this computation is supplied to computational unit 16 which computes either −F or $[(N-1)/2] \cdot F$ depending upon whether the index position for the erasure is odd or even, respectively. The resultant character value is supplied to symbol generator 17 which operates to map the character value associated with erasure position j, namely CV(j), to its appropriate symbol in accordance with a table such as that seen in FIG. 4. However, it is noted that while FIG. 4 is representative of one set of mappings between character values and symbols, it should not be taken as being limiting in any way. In particular, it is seen that, in general, the symbol set is essentially arbitrary in nature, the only restriction being that the character values run from 0 through N−1. Furthermore, as pointed out above, even the utilization of the integers from 0 through N−1 is provided essentially for the convenience of being able to describe the algorithm in terms of arithmetic modulo N. However, it is noted that once N is fixed, it is then possible to describe the process of the present invention in terms of more abstract mathematical field variables and character values selected from elements of an abstract set, without departing from the spirit of the present invention.

With respect to an apparatus which is capable of encoding symbols of the present invention so as to provide a set of message symbols with a check symbol, attention is specifically directed to the block diagram shown in FIG. 7. For example, the selected code symbols to be transmitted, imprinted or otherwise encoded may be supplied to register 20. Register 20 then provides M of these code symbols to character value generator 21 which operates to assign a numeric character value from 0 through N−1 to each of the M positions. The positions having an even index are supplied to even position summer 22 and the odd indexed character values are supplied to odd position summer 23. Summers 22 and 23 both operate using arithmetic modulo N to produce output values $F_e$ and $F_o$ respectively. The value $F_e$ is multiplied by doubler 24 which also operates modulo N. The doubled result together with $F_o$ is supplied to modulo N summer 25 which produces a value F ranging from 0 through N−1 representing the algebraic number $F_o + 2 F_e = F$. Next, the character value associated with this value of F is generated by computer means 26 which operates to produce the character value CV(j) associated with the $j^{th}$ position where j is the integer index for the check sum position. This character value is computed as $[(N-1)/2] \cdot F$ modulo N. The resulting character value, CV(j) is supplied to symbol generator 27 which operates to map CV(j) to an appropriate code symbol. This code symbol is then inserted in an appropriate position in the output sequence, which also preferably includes the M input code symbols already present in register 20. In this way, a set of M+1 symbols is encoded and includes a single check sum symbol.

While the various computing and summing means illustrated in FIGS. 6 and 7 may be embodied in the form of special purpose hardware to carry out each of the indicated functions, preferred embodiments of the present invention employ a single general purpose digital processor programmed to carry out the desired functions in accordance with the steps illustrated in FIGS. 1 and 2. Such an apparatus may include microprocessor chips disposed on a small printed circuit board with appropriate circuitry for interfacing with the symbol reader.

From the above, it should therefore be appreciated that single error correction for symbol based codes is readily achievable and includes apparatus which is both economical and capable of high speed operation. In particular, it is noted that the modulo N arithmetic operations described herein may in fact be readily implementable in the form of operation tables. Thus, the computation of $F_o + 2 F_e$ may in fact be accomplished by means of a single table lookup operation. The same is also true for the computation carried out by computer means 26 in FIG. 7. It should also be appreciated that the present invention is not specifically limited to bar code applications but is generally applicable to any symbol based code, including optical character recognition coding methodologies. It should also be appreciated that the present invention is very easy to implement and requires only a minimum of overhead circuitry. Additionally, the method and apparatus of the present invention is capable of working with any number M of code symbols. Accordingly, it is therefore also readily appreciated that the method and apparatus of the present invention may be extended to those situations in which symbols are encoded in blocks and in which each block includes a check symbol such as that provided by the apparatus of FIG. 7. Similarly, there may be provided check symbols associated with previously encoded blocks which already include check symbols. Thus it is seen that the method and apparatus of the present invention are readily extendable to provide greater error correction capabilities. Such extensions include all of the ways in which general binary codes are extendable including the arrangement of symbols to be encoded in two, three and higher dimensional arrays.

While the invention has been described in detail herein in accordance with certain preferred embodiments thereof, many modifications and changes therein may be effected by those skilled in the art. Accordingly, it is intended by the appended claims to cover all such modifications and changes as fall within the true spirit and scope of the invention.

We claim:

1. A method for correcting a received sequence of coded character symbols having one erasure, said method comprising the steps of:

setting initial character value of position j, CV(j), equal to 0, where j denotes the position of the erasure;

forming sum, $F_o$, of preassigned character values associated with said character symbols, said sum being carried out for all sequence positions having an odd position number, said sum being carried out modulo N where N is odd and is also the number of code symbols;

forming sum, $F_e$, of preassigned character values associated with said character symbols, said sum being carried out for all sequence positions having an even position number, said sum being carried out modulo N;

forming check sum F as $F_o + 2 F_e$ modulo N;

computing character value of the erasure position, CV(j), as −F modulo N if j is odd and as $[(N-1)/2] \cdot F$ modulo N if j is even; and associating a corrected erasure position character symbol with character value CV(j) in accordance with said preassigned character value association.

2. The method of claim 1 in which N is 35.

3. A method for decoding a received sequence of character symbols and erasure, said method comprising the steps of:

determining how many erasures occurred;

providing an indication of an uncorrectable error if the number of erasures exceeds one;

determining if there is exactly one erasure and applying the correction procedure of claim 1 in this even;

determining if there are no erasures and applying said forming steps to compute check sum F; and providing an indication of an uncorrectable error in the event that F is not equal to 0 (modulo N), otherwise accepting the received sequence as correct.

* * * * *